(12) United States Patent
Song (10) Patent No.: US 7,480,689 B2
(45) Date of Patent: Jan. 20, 2009

(54) SYSTOLIC DE-MULTIPLEXED FINITE IMPULSE RESPONSE FILTER ARRAY ARCHITECTURE FOR LINEAR AND NON-LINEAR IMPLEMENTATIONS

(75) Inventor: William S. Song, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 743 days.

(21) Appl. No.: 10/993,076

(22) Filed: Nov. 19, 2004

(65) Prior Publication Data

US 2006/0112157 A1 May 25, 2006

(51) Int. Cl.
*G06F 17/10* (2006.01)
(52) U.S. Cl. ...................................... 708/300
(58) Field of Classification Search .......... 708/300–323
See application file for complete search history.

(56) References Cited

U.S. PATENT DOCUMENTS

| | | | | |
|---|---|---|---|---|
| 4,725,972 A | * | 2/1988 | Gockler | 708/313 |
| 4,758,999 A | | 7/1988 | Marwood et al. | |
| 5,450,339 A | | 9/1995 | Chester et al. | |
| 5,917,735 A | * | 6/1999 | Ko | 708/313 |
| 6,014,682 A | | 1/2000 | Stephen et al. | |
| 6,023,718 A | * | 2/2000 | Dischert et al. | 708/307 |
| 6,032,171 A | * | 2/2000 | Kiriaki et al. | 708/819 |
| 6,141,378 A | * | 10/2000 | d'Oreye de Lantremange | 708/323 |
| 6,192,386 B1 | | 2/2001 | Shinde | |
| 6,324,559 B1 | * | 11/2001 | Hellberg | 708/321 |
| 6,362,701 B1 | * | 3/2002 | Brombaugh et al. | 708/313 |
| 6,639,537 B1 | | 10/2003 | Raz | |
| 6,650,688 B1 | | 11/2003 | Acharya et al. | |
| 6,731,706 B1 | | 5/2004 | Acharya et al. | |
| 6,820,103 B2 | * | 11/2004 | Butler et al. | 708/319 |
| 6,970,895 B2 | * | 11/2005 | Vaidyanathan et al. | 708/300 |
| 7,188,135 B2 | * | 3/2007 | Takatori et al. | 708/319 |
| 2003/0200243 A1 | * | 10/2003 | Yomo et al. | 708/306 |
| 2004/0143615 A1 | * | 7/2004 | Yomo et al. | 708/300 |
| 2006/0133470 A1 | | 6/2006 | Raz et al. | |

OTHER PUBLICATIONS

International Search Report for International Application No. PCT/US2005/037083 dated Nov. 13, 2006 (3 pgs).

(Continued)

*Primary Examiner*—Chat C Do
(74) *Attorney, Agent, or Firm*—Guerin & Rodriguez, LLP; Michael A. Rodriguez (57) ABSTRACT

Described is a finite impulse filter response (FIR) filter for use by signal processors. A demultiplexer receives input data samples at an input data rate. The FIR filter includes a plurality of computational units arranged in a systolic array of taps and phases. Each computational unit operates at an array clock rate that is slower than the input data rate. During each array clock cycle, the phases produce a plurality of output data samples that provides an output data rate equal to the input data rate. The FIR filters can thus support an output data rate equal to the input data rate although the input data rate exceeds the maximum clock speed of the processor. The FIR filter can also operate at a reduced array clock speed, while continuing to produce an output data rate equal to the input data rate, to increase the power efficiency of the processor.

35 Claims, 8 Drawing Sheets

OTHER PUBLICATIONS

Bique, Stephen; University of Alaska Fairbanks; "Embedded Programming on Massively Parallel Device"; 7 pgs.

Wang, D. et al.; High Technology Letters; "A Low Power/Area Digital FIR Filter Design Based on PRF Framework"; vol. 8, No. 3, pp. 57-61; Sep. 2002.

Wang, C. et al.; IEEE; "A Digit-Serial VLSI Architecture for Delayed LMS Adaptive FIR Filtering"; pp. 545-548; Feb. 1995.

Abdel-Raheem, E. et al.; IEEE; "Systolic Implementation of Polyphase Decimators and Interpolators"pp. 749-752; May 1995.

Lee, J. et al.; Chungbuk National University; "Bit-level Systolic Array for FIR Filter Using AND-based Bit-serial Multiplier"; pp. 87-90.

Lee, H. et al.; National Chiao Tung University; "The Design of Two-Dimensional FIR and UR Filter Architectures for HDTV Signal Processing"; VLSITSA 1991; pp. 307-311.

Song, W. et al.; IEEE; MIT Lincoln Laboratory; "High-Performance Low-Power Bit-Level Systolic Array Signal Processor with Low-Threshold Dynamic Logic Circuits"; 2001; pp. 144-147.

Kam et al., Nonlinear Equalization of {RF} Receivers, Proc. HPCMP Users Group Conf., 2006, pp. 303-307, IEEE Computer Society, Denver CO.

Kam et al., Nonlinear Equalization of {RF} Receivers, Proc. Tenth Annual HPEC Workshop, Sep. 19, 2006, Lexington MA.

\* cited by examiner

SYSTOLIC DE-MULTIPLEXED FINITE IMPULSE RESPONSE FILTER ARRAY ARCHITECTURE FOR LINEAR AND NON-LINEAR IMPLEMENTATIONS

GOVERNMENT RIGHTS IN THE INVENTION

This invention was made with United States government support under Contract No. F19628-00-C-0002 awarded by the Defense Advanced Research Project Agency (DARPA). The government may have certain rights in the invention.

FIELD OF THE INVENTION

The invention relates generally to signal processing. More specifically, the invention relates to finite impulse response (FIR) filters used in various signal-processing applications.

BACKGROUND

Many high-speed signal-processing applications use finite impulse response (FIR) filters to perform high-speed linear filtering. Examples of such signal-processing applications include, but are not limited to, communications, video, radar, electronic warfare, and signal intelligence. Some applications use FIR filters in combination with other computational modules, such as multipliers, to implement nonlinear filters. In addition, different FIR filter designs can produce a wide variety of desired frequency responses.

Figure 1:
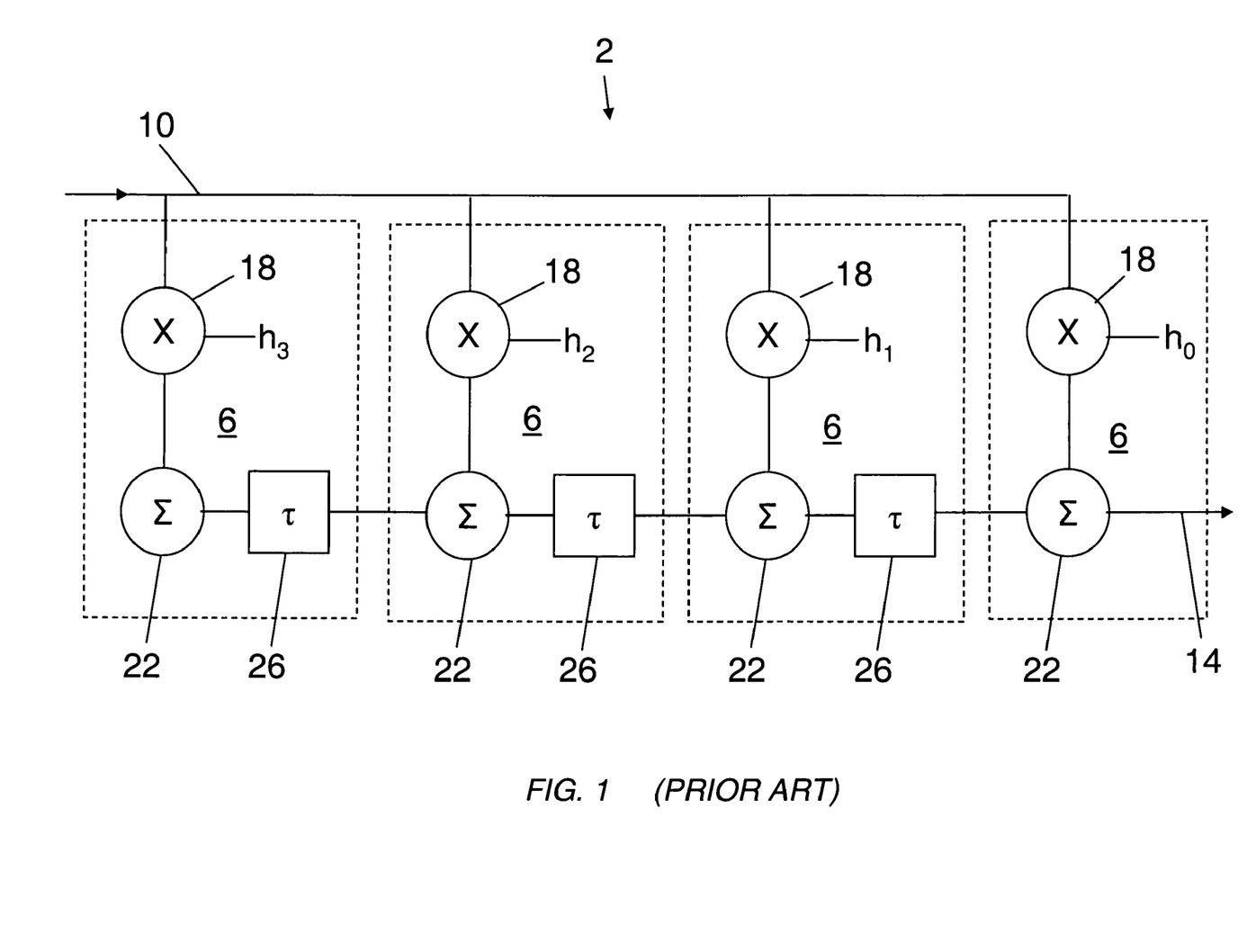
FIG. 1 is a functional block diagram of an example of a prior art finite impulse response filter.

In general, a FIR filter includes a series of delays, multipliers, and adders that cooperate to produce a filter output. For example, FIG. 1 shows a conventional transposed FIR filter 2 having a series of stages or taps 6 (here, four), an input line 10 for conveying input data, and an output line 14 for conveying the output data produced by the FIR filter 2. Each tap 6 includes a multiplier 18, an adder 22, and, with the exception of the last tap in the series, a delay 26. Input data pass concurrently to each multiplier 18 over the input line 10, and each multiplier 18 multiplies the input data by a coefficient (here, $h_3$, $h_2$, $h_1$, or $h_0$). The result produced by each multiplier 18 passes to the adder 22 of the same tap 6 as that multiplier 18. Each adder 22 produces a sum that passes to the delay 26 of the same tap 6 as that adder 22. Upon a subsequent clock cycle, the sum passes from the delay 26 to the adder 22 of the neighboring tap 6. For the last tap 6 in the series, the sum produced by the adder 22 corresponds to output data produced by the filter. In general, the filtering behavior of a FIR filter depends on the length of the filter (i.e., number of taps) and values of the coefficients. In this example, the output data is a function of four samples of input data. In the generating of the output data, the clock rate of the FIR filter is necessarily as fast as the input data sample rate.

Implementations of FIR filters for high-speed (i.e., data rate) applications often occur on application-specific processors because they are often capable of providing higher computational throughput and greater power efficiency than programmable processors. Technology for producing application-specific processors includes field-programmable gate arrays (FPGA), gate arrays, standard cells, and fully custom integrated circuits. Considerations taken in the design of such chips involve maximizing clock speed and computational throughput and minimizing die area and power consumption. In some instances, the input data rate required for the FIR filter exceeds the performance capability of the computational circuitry. In other instances, the computational circuitry can sustain the input data rate, but at the cost of consuming excessive power. Thus, there is a need for a FIR filter for linear and nonlinear filtering applications that can sustain the required input data rate without consuming excessive power.

SUMMARY

In one aspect, the invention features a signal processor having a demultiplexer that receives input data samples at an input data rate and a finite impulse response (FIR) filter in communication with the demultiplexer for obtaining input data samples therefrom. The FIR filter includes a plurality of computational units arranged in an array having a plurality of taps and a plurality of phases. Each computational unit operates synchronously at an array clock rate that is slower than the input data rate.

In another aspect, the invention features a finite impulse response (FIR) filter for filtering input data samples. The FIR filter includes a plurality of computational units arranged in a systolic array having a plurality of columns and a plurality of rows. Each column of computational units corresponds to one of a tap and a phase and each row of computational units corresponds to the other of a tap and a phase. Each computational unit in one phase other than a last phase is in communication with a first computational unit in a neighboring tap over a first signal line for communicating a computed value and with a second computational unit in the neighboring tap over a second signal line for communicating an input data sample.

In yet another aspect, the invention features a finite impulse response (FIR) filter for filtering input data samples. The FIR filter includes a plurality of computational units arranged in a systolic array having a plurality of columns and a plurality of rows. Each column of computational units corresponds to one of a tap and a phase and each row of computational units corresponds to the other of a tap and a phase. Each computational unit in a tap other than a last tap has 1) a first input signal line for receiving an input data sample; 2) a second input signal line for receiving a coefficient; 3) a third input signal line for receiving a supplied value; 4) circuitry for computing a value based on the received input data sample the coefficient, and the supplied value; 5) a first output signal line for communicating the value computed by that computational unit to a computational unit in a neighboring tap; and 6) a second output signal line for communicating the received input data sample to a computational unit in a neighboring phase of the neighboring tap.

In still another aspect, the invention features a signal processor comprising a demultiplexer receiving input data samples and a first finite impulse response (FIR) filter in communication with the demultiplexer for obtaining the input data samples therefrom. The first FIR filter includes a first plurality of computational units arranged in an array having a plurality of taps and a plurality of phases and a first set of coefficients used by the first plurality of computational units to compute values based on the input data samples. The signal processor also includes a second FIR filter in communication with the demultiplexer for obtaining the input data samples therefrom. The second FIR filter includes a second plurality of computational units arranged in an array having a plurality of taps and a plurality of phases and a second set of coefficients different from the first set of coefficients. The second set of coefficients is used by the second plurality of computational units to compute values based on the input data samples.

In still yet another aspect, the invention features a method of linearly filtering input data samples. Input data samples are received at an input data rate and forwarded to an array of computational units of a finite impulse filter (FIR) having a plurality of taps and a plurality of phases. Each computational unit operates at an array clock rate that is slower than the input data rate.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

The present invention features a finite impulse response (FIR) filter for use by application-specific processors in applications requiring high-speed linear filtering. When working with other computational modules, FIR filters of the invention can also implement high-speed nonlinear filters. Examples of such high-speed applications include satellite communications links, terrestrial microwave communications links, and instrumentation. Use of the FIR filter of the invention is also particularly advantageous in high-speed applications, such as mobile communications, for which power efficiency (i.e., low power consumption) is essential.

The FIR filter of the invention has a systolic array architecture. A systolic array, as used herein, is an arrangement of computational units (or processors) in rows and columns. Data flow synchronously between neighboring computational units. During any given clock cycle, the flow of data can occur in multiple directions across the array. Each computational unit may receive data from one or more neighbors, process the data to produce output data, and forward output data to a neighboring computational unit.

The computational units of the present invention are regular and modular, and thus well suited for Very Large Scale Integration (VLSI) implementation on a semiconductor or integrated circuit chip (e.g., an Application-Specific Integrated Circuit (ASIC) device). In one embodiment, described herein, columns of computational units correspond to taps and rows correspond to phases. Multiple phases enable concurrent handling of multiple samples of input data. In general, the greater the number of phases, the greater the output data rate that the FIR filter can achieve. Thus, by having a sufficient number of phases, FIR filters of the invention can support an output data rate equal to the input data rate although the maximum clock speed of the application-specific processor (i.e., the maximum clock rate at which computational units can synchronously produce output data) is slower than that input data rate. Further, this capability enables FIR filters of the invention to operate, by design, at a reduced array clock speed (e.g., less than maximum) in order to increase the power efficiency of the application-specific processor, while continuing to achieve an output data rate equal to the input data rate. Other embodiments of FIR filters produce output data rates that are greater than or less than the input data rate.

Figure 2:
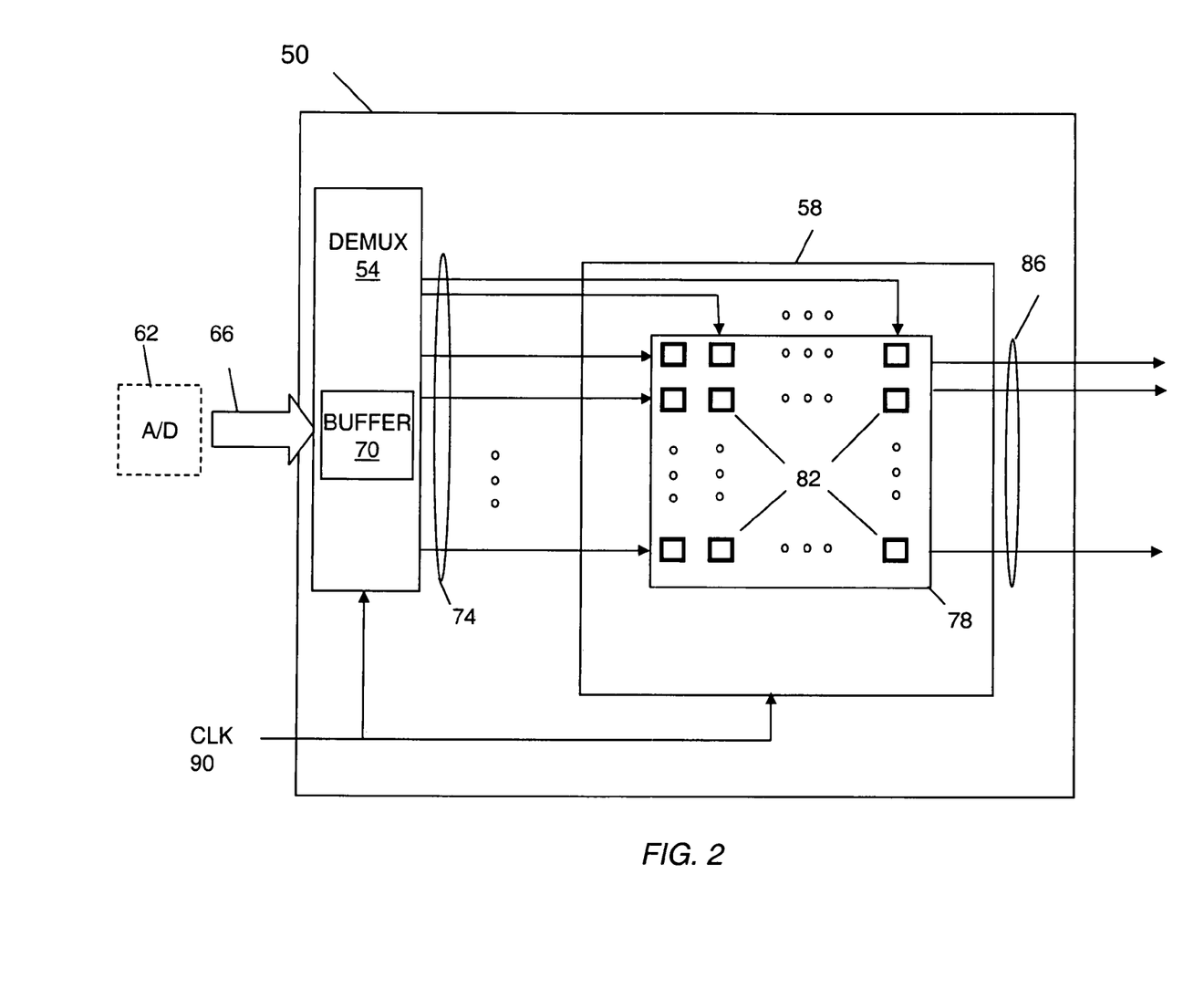
FIG. 2 is a functional block diagram of an embodiment of an application-specific processor having a finite impulse response (FIR) filter constructed in accordance with the principles of the invention.

FIG. 2 shows a functional block diagram of an embodiment of an application-specific processor 50, constructed in accordance with the invention, for use in filtering input data samples acquired by a signal-processing application. For ASIC implementations, hardware (or circuitry) such as multipliers, adders, and registers, implement the filtering functionality of the application-specific processor 50. In other embodiments, the application-specific processor 50 may be programmable, have its own native instruction code and local registers, and be designed to execute arithmetic operations more rapidly and efficiently than standard microprocessors. The application-specific processor 50 may also implement instruction-level parallelism and operate in an architecture that supports multiple operations in a single clock cycle. Examples of such implementations of an application-specific processor are finite state machines and digital signal processors or DSPs.

The application-specific processor 50 includes a demultiplexer 54 and a digital FIR filter 58. In other embodiments, implementation of the demultiplexer 54 can be external to the application-specific processor 50 without departing from the principles of the invention. The demultiplexer 54 is in communication with a computational module 62, i.e., computational logic or circuitry, by way of a signal bus 66. Here, an analog-to-digital (A/D) converter illustrates an example of the computational module 62. Although shown external to the application-specific processor 50, this computational module 62 can be part of the application-specific processor 50 without departing from the principles of the invention.

Digital input data arrive sequentially at the demultiplexer 54 from the computational module 62 over the signal bus 66. These digital input data correspond to data samples acquired by the signal-processing application at discrete moments in time. Typically, data samples of high-speed applications can have 8 to 16 bits of data, and those of high-precision applications as many as 32 bits. Other data sample sizes can be used without departing from the principles of the invention. Hereafter, the digital input data are also referred to as input data samples. Arrival of these input data samples at the demultiplexer 54 occurs at a given rate, hereafter referred to as the input data rate, in accordance with an input clock. The demultiplexer 54 has circuitry, including a buffer, capable of handling the input data samples at the input data rate. The buffer 70 can hold a sufficient number of the incoming data samples so that a plurality of such data samples can be sent concurrently to the FIR filter 58, as described in more detail below. A plurality of signal lines 74 provides communication between the demultiplexer 54 and the FIR filter 58 for conveying the input data samples.

The FIR filter 58 includes a systolic array 78 of computational units (or processors) 82 interconnected in accordance with the invention. The arrangement of computational units 82 includes a plurality of columns and a plurality of rows. Each column corresponds to a different tap of the FIR filter 58 and each column corresponds to a different phase. In general, each computational unit 82 includes circuitry for multiplying an input data sample by a coefficient (predetermined or dynamically determined) and summing the multiplication results with the computed results of a previous tap. The FIR filter 58 performs linear filtering, with the values of the various coefficients determining the impulse response.

Delay circuitry within each computational unit 82 may hold the computed sum for a predetermined period (e.g., an array clock cycle) before that sum passes to the next tap. A plurality of output signal lines 86, here, one output signal line 86 for each row of computational units, conveys the output results produced by the rightmost column of the array 78. The application-specific processor 50 can also have a multiplexer (not shown) that receives and arranges the output data samples into a desired order.

An advantage of the present invention is that the layout of logic or circuitry of each computational unit 82 is repeatable; that is, a structured layout "cell" of gates and other logic structures for implementing the functionality of one computational unit can be used to produce an array of such computational units. This repeatability simplifies the design and construction of an ASIC device, for example, that implements the application-specific processor 50 of the invention. Consequently, the performance of the FIR filter 58 can be readily altered by adding or removing columns or rows of computational units. Adding or removing rows affects the extent to which the incoming data samples can be de-multiplexed, and thus the degree to which the array clock speed of the application-specific processor 50 can be reduced and still achieve an output data rate equal to the input data rate. Adding or removing columns can affect the performance of the filter's impulse response (i.e., the number of input data samples and coefficients that are involved in producing an output data sample).

A clock signal (CLK) 90 passes to the application-specific processor 50 and synchronizes the operations of the demultiplexer 54 and of the computational units 82 of the FIR filter 58. In general, the array clock rate of the clock signal is slower than input data rate by a factor of N, where N is equal to the number of phases in the FIR filter 58. The N phases enable the application-specific processor 50 to operate at the reduced speed and still achieve an output data rate equal the input data rate. Further, because of the slower array clock rate the application-specific processor 50 consumes less power and generates less heat than if operated at a faster clock rate, particularly when the application-specific processor 50 and its computational units 82 are especially designed to consume less power per computation by taking advantage of the slower clock rate.

During operation, input data samples and computed results move across the array 78 in synchronism with each clock signal. In brief overview, during each array clock cycle input data samples arrive from the demultiplexer 54 concurrently at the first column (here, leftmost column) and at the first row (here, topmost row) over the input signal lines 74. Each computational unit 82 computes a value based on the input data sample received by that computational unit and on any computed results received from a neighboring computational unit. Each column of computational units other than the last (here, rightmost) column communicates computed results to those computational units in a neighboring column. In addition, each column other than the last column communicates previously received input data samples to those computational units in the neighboring column, as described in more detail below. Each computational unit in the last column of the array 78 communicates a computed value corresponding to an output data sample over one of the output signal lines 86. It is to be understood that the terms left, right, top, bottom, leftmost, rightmost, topmost and bottommost, as used herein, are relative terms: the principles of the invention apply irrespective of the direction in which input data samples and computed results flow through the systolic array. Similarly, other embodiments of the FIR filter can arrange the direction of flow across the array such that the rows correspond to taps and the columns correspond to phases.

Figure 3:
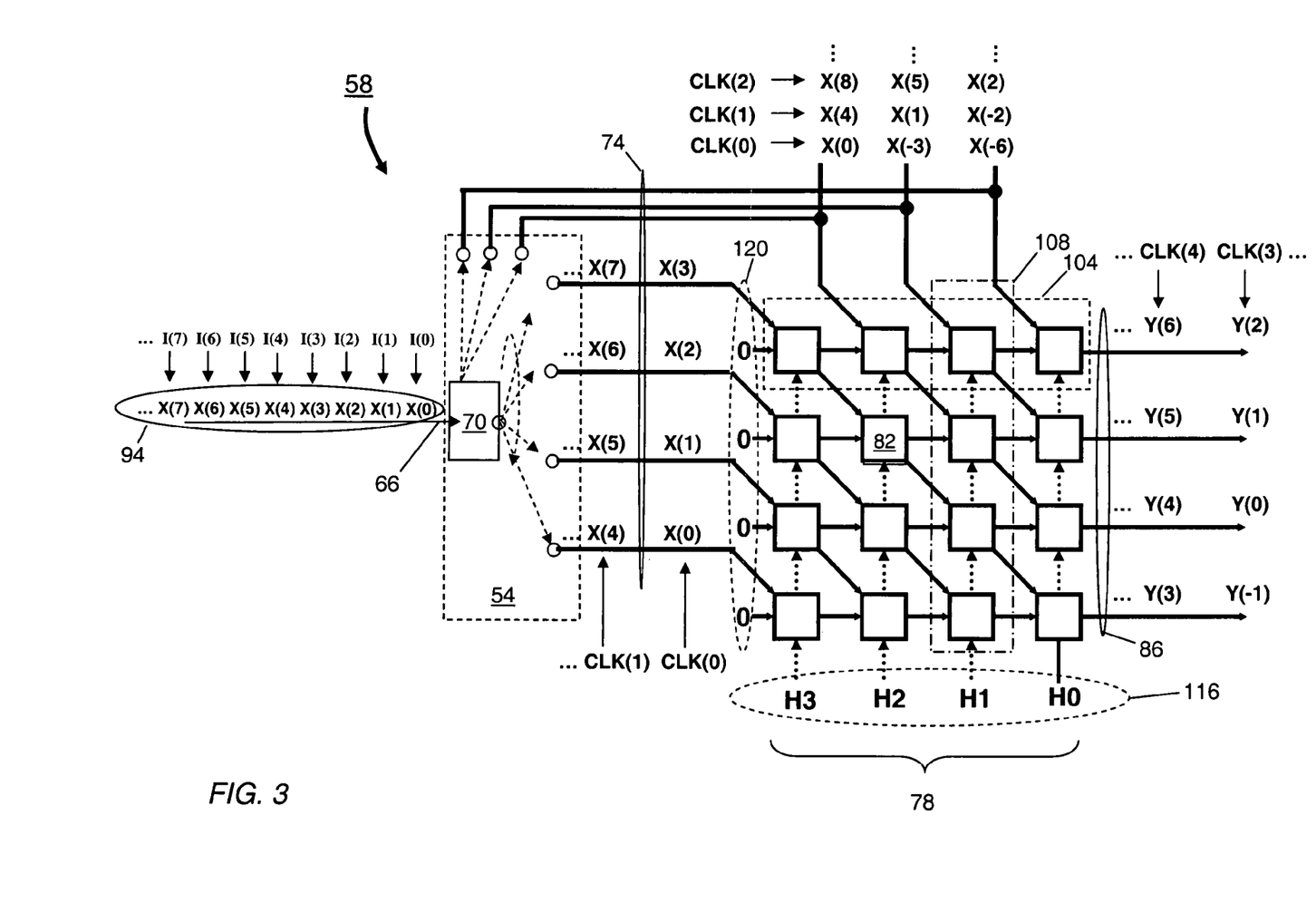
FIG. 3 is a functional block diagram of an embodiment of the FIR filter of the present invention, including a systolic array of computational units.

FIG. 3 shows an embodiment of the FIR filter 58 as a two-dimensional four-by-four systolic array 78 of computational units 82. This particular embodiment has four rows 104 and four columns 108 of computational units 82. Other embodiments of arrays have fewer or more than four columns or fewer or more than four rows. For clarity purposes, FIG. 3 has reference numerals for only one computational unit 82, one row 104, and one column 108 of the systolic array 78.

Each computational unit 82 includes at least three input signal lines. Over a first one of the input signal lines, each computational unit 82 receives an input data sample 94 either from the demultiplexer 54 or from a computational unit 82 in a neighboring column. In FIG. 3, the data samples 94 are identified as X(t), where t represents the time of the data sample according to an input clock (denoted I(t)). The input clock determines the input data rate. Over a second one of the input signal lines, each computational unit 32 receives a coefficient 116. Each column 108 receives a different coefficient 116, which are identified in FIG. 3 as H3, H2, H1, and H0. Each computational unit 82 within a column 108 receives the same coefficient. Coefficients are independent of the array clock. Over a third one of the input signal lines, computed results arrive from a computational unit in a neighboring column. For computational units in the first column of the array, a zero value 120 arrives instead.

Each computational unit 82 also includes at least two output signal lines. By way of a first output signal line, each computational unit in a column other than the last column communicates a computed value to a computational unit that is in the same row in a neighboring column. For each computational unit in the last column of the array 78, the output data sample produced by that computational unit passes over this output signal line. Over the second output signal line, each computational unit in a column other than the last column communicates a previously received input data sample to a computational unit in a neighboring row and neighboring column (i.e., along a diagonal of the array).

As described in more detail below, each computational unit 82 also includes circuitry (not shown) for computing a value based on a received input data sample, the coefficient, and the computed results received from another computational unit (or the zero value). The data and arithmetic performed by the computational units 82 can be of a complex kind. Complex data consist of real and imaginary parts, sometimes referred to as in-phase and quadrature parts.

During operation of the FIR filter 58, a sequence of data samples 94 arrives at the demultiplexer 54 on signal bus 66. In this embodiment, the demultiplexer 54 buffers the data samples 94 so that seven data samples can pass concurrently to the first row 104 and first column 108 of computational units (one for each of the four rows and one for each of the three remaining columns). The demultiplexer 54 directs data samples to each row 104 of the first column 108 in round robin fashion. For example, during array clock cycle CLK(0), the demultiplexer 54 directs data sample $X_0$ to the bottom row, data sample $X_1$ to the row above the bottom row, data sample $X_2$ to the row above the row receiving the data sample $X_1$, and data sample $X_3$ to the top row. During the next array clock cycle CLK(1), data sample $X_4$ passes to the bottom row, data sample $X_5$ to the row above the bottom row, data sample $X_6$ to the row above the row receiving the data sample $X_5$, and data sample $X_7$ to the top row.

During each array clock cycle (CLK(t), where t corresponds to time according to an array clock), the demultiplexer 54 also sends certain data samples to the remaining other columns of the array 78. Some of these data samples (e.g., $X_0$, $X_4$) arrive concurrently at two different columns (first and second columns). The demultiplexer 54 sends other data samples (e.g., $X_1$, $X_5$) to two different columns (first and third columns) after a delay of a single array clock cycle. Still other data samples (e.g., $X_2$, $X_6$) arrive at two different columns (first and fourth columns) after a two clock-cycle delay.

As described above, the input data samples and computed results propagate from each column to a neighboring column for each array clock cycle. Input data samples propagate along diagonals of the array 78 and computed results propagate along the rows. In this embodiment, upon each array clock cycle the FIR filter 58 produces four output data samples.

FIGS. 4A through FIG. 4D each show a different embodiment of the computational unit 82 of FIG. 3 (shown respectively as computational units 82, 82', 82", 82'''). Computational units of a systolic array of the invention are all of the same type; that is, whichever embodiment of computational unit is used, each computational unit 82 in the array employs that same embodiment.

Each of these embodiments includes a multiplier 150, an adder 154, and a pair of delays 158, 162. The multiplier 150 includes two input signal lines: a first signal line 166 conveys the data sample upon which the multiplier operates, and a second signal line 170 conveys a coefficient by which the data sample is multiplied. The result produced by the multiplier 150 passes to the adder 154 over an output signal line 174 (i.e., signal line 174 is also a first input signal line to the adder 154). The adder 154 has a second input signal line 178 by which the results of a neighboring computational unit 82 in the same row arrive at the present computational unit 82. In the case of the first column in the array, the value arriving on this second signal line 178 is zero. The adder 154 also includes an output signal line 182. Over the output signal line 182, the sum of the values arriving on the input signal lines 174, 178 pass to the neighboring computational unit in the next column on the same row (or, over an output signal line 86).

Figure 4A:
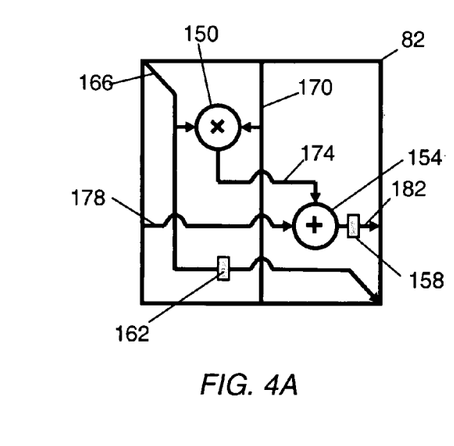
FIG. 4A, FIG. 4B, FIG. 4C, and FIG. 4D are functional diagrams of four different embodiments of computational units that can be used to implement the FIR filter of the present invention.

The location of the delays 158 and 162 within a computational unit 82 distinguish among the various embodiments. The embodiments illustrated in FIGS. 4A-4D correspond to four different combinations of locations of the delays 158, 162 within a computational unit. FIG. 4A shows the computational unit 82 as having the delay 158 in the output signal line 182 after the adder 154. In addition, the delay 162 is disposed on the input signal line 174 after the multiplier 150. During the current array clock cycle, the incoming data sample passes concurrently to the multiplier 150 and to the delay 162, where the data sample remains until the next array clock cycle. The multiplier 150 multiplies the data sample by a coefficient and sends the results to the adder 154. Also during the current cycle, the adder 154 receives a sum from a computational unit in the preceding neighboring column (or a zero value) and adds this value to the multiplication results. These results pass to the delay 158, which holds the results until the next array clock cycle.

Figure 4B:
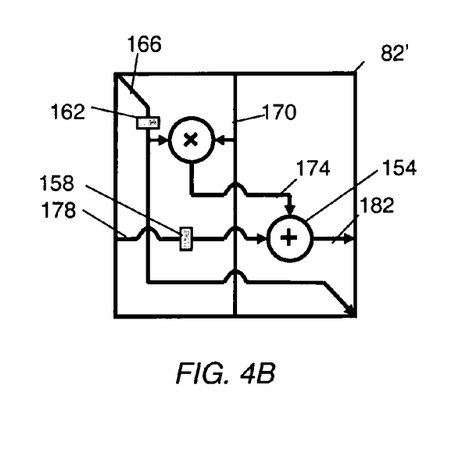

The computational unit 82' of FIG. 4B has the delay 158 in the input signal line 178 before the adder 154 and the delay 162 in the input signal line 174 before the multiplier 150. During the current array clock cycle, the delay 158 receives a sum from a computational unit in the preceding neighboring column, and the delay 162 receives an incoming data sample. The delay 158 holds this sum and the delay 162 holds the data sample until the next array clock cycle. Thus, the multiplication and addition operations upon this incoming data sample and this incoming sum occur upon the next array clock cycle. In the current array clock cycle, the multiplier 150 and adder 154 operate upon the data sample and sum received and held by the delays 162 and 158, respectively, during the previous array clock cycle, with the results of the multiplication and addition passing to the next column (or to an output signal line 86).

Figure 4C:
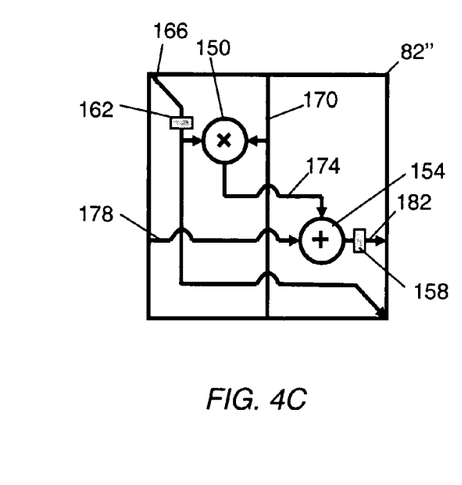

The computational unit 82" of FIG. 4C has the delay 158 in the output signal line 182 after the adder 154 and the delay 162 in the input signal line 174 before the multiplier 150. During the current array clock cycle, the delay 162 receives and holds an incoming data sample. Multiplication of this incoming data sample by a coefficient is thus held by the delay 162 until the next array clock cycle. In the current array clock cycle, the multiplier 150 multiplies the data sample received and held during the preceding array clock cycle by a coefficient and forwards the results to the adder 154. The adder 154 adds these multiplication results to a sum received from a computational unit in a preceding neighboring column during the current array clock cycle. The delay 158 holds the results of this addition operation until the next array clock cycle.

Figure 4D:
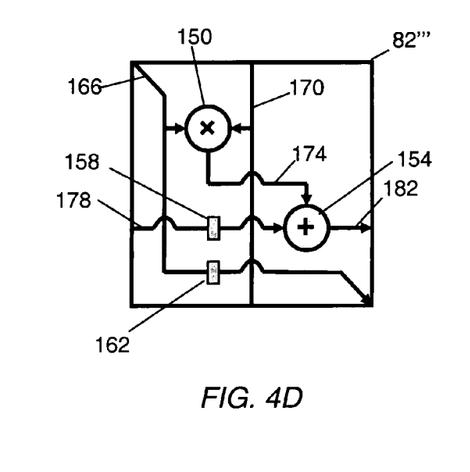

In FIG. 4D, the computational unit 82''' has the delay 158 in the input signal line 178 before the adder 154 and the delay 162 on the input signal line 174 after the multiplier 150. During the current array clock cycle, the delay 158 receives and holds an incoming sum from a neighboring computational unit (or zero value) and the delay 162 receives and holds an incoming data sample. The incoming data sample also passes to the multiplier 150 and is multiplied by a coefficient. The multiplication results pass to the adder 154. To these multiplication results, the adder 154 adds a sum received during a previous array clock cycle from a neighboring computational unit (or zero value) and held by the delay 158 until the current array clock cycle. The results of the multiplication and addition pass to the next column (or to an output signal line 86) during the current array clock cycle.

The computations performed by the computational units of FIGS. 4A-4D are described above as occurring during a single array clock cycle. In other embodiments, the computational units can be pipelined; that is, arithmetic computations may require multiple array clock cycles. In such embodiments, the latency of each computational unit is equal to multiple array clock cycles. Notwithstanding the multiple-clock-cycle latency of the computational units, the operation of the FIR filter array remains unaffected (i.e., the type of computations, direction of flow of input data samples and of computed values across the array) and still achieves the same data throughput rate. The communication of input data samples and delays can also be "pipelined" so that computational throughput can be increased without affecting array operation. In this case, the output latency of the FIR filter array increases by a number of array clock cycles (in comparison to the above-described embodiments of FIR filter arrays in which the latency of each computational unit is one array clock cycle).

Figure 5A:
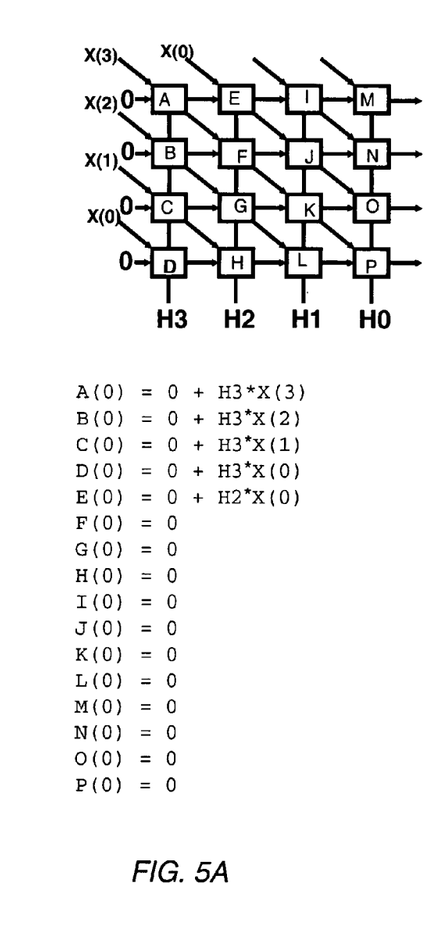
FIG. 5A, FIG. 5B, FIG. 5C, FIG. 5D, and FIG. 5E illustrate a sequence of operation of a FIR filter of the present invention.

FIGS. 5A-5E illustrate an exemplary performance of the systolic array 78 of FIG. 3 during five initial consecutive array clock cycles. For the purpose of this example, the latency of each computational unit is one array clock cycle. FIG. 5A corresponds to the first array clock cycle, FIG. 5B the second, FIG. 5C the third, FIG. 5D the fourth, and FIG. 5E the fifth array clock cycle. The five array clock cycles are numbered zero through four. Letters A(t) through P(t) identify the different computational units 82 of the array 78, where t identifies a particular one of the array clock cycles. Before time zero (t=0), each input X has a zero value. The letter X(t) identifies an input data sample, with t here identifying the time of that data sample according to the input clock. In this example, the input clock produces an input data rate that is 4 times faster than the array clock rate. The letter Y(t) identifies an output data sample produced by a row of computational units. Here, the t provides a correspondence between the sequence of output data samples and the sequence of input data samples.

During the first array clock cycle, as shown in FIG. 5A, four different input data samples, X(0), X(1), X(2) and X(3), pass concurrently to the rows 104 (FIG. 3) of the array 78. The demultiplexer 54 stores incoming input data samples in the buffer 70 so that the four rows 104 can each receive a data sample simultaneously. The demultiplexer 54 also passes the input data sample X(0) to the computational unit E in the second column of the topmost row. Consider, for example, that the computational circuitry of each computational unit is implemented in accordance with the embodiment shown in FIG. 4A. Thus, during the first array clock cycle CLK(0), the computational units have computed values based on the input data sample, coefficient, and previous column's sum (or zero value) as follows:

| Computational Unit (array clock cycle) | Computed Value |
| --- | --- |
| A(0) | 0 + H3*X(3) |
| B(0) | 0 + H3*X(2) |
| C(0) | 0 + H3*X(1) |
| D(0) | 0 + H3*X(0) |
| E(0) | 0 + H2*X(0) |
| F(0) through P(0) | 0 |

Figure 5B:
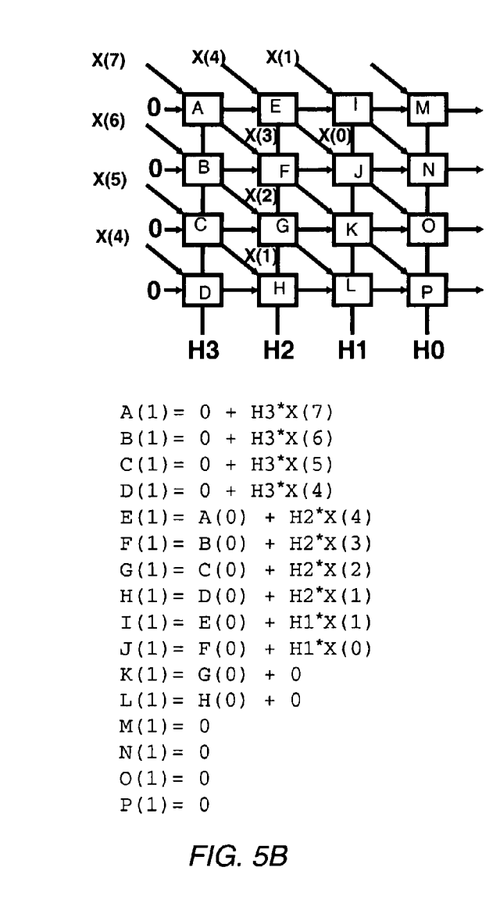

Upon the next array clock cycle CLK(1), the demultiplexer 54 distributes the input data samples X(4), X(5), X(6) and X(7) to the rows in round-robin fashion. The demultiplexer 54 also passes the data sample X(4) to the computational unit E in the second column of the topmost row and the data sample X(1) to the computational unit I in the third column of the topmost row. The data samples X(1), X(2) and X(3) propagate from the first column to a computational unit in a neighboring column along a diagonal of the array. The data sample X(0) propagates from the second column to a computational unit in a third column, also along a diagonal. In addition, the results computed by the computational units A-D in the first column propagate to a computational unit in the second column in the same row as that computational unit. Similarly, the results computed by the computational units E propagate to the computational unit I in third column in the same row. Also, in the second array clock cycle, the computational units produce computed values as follows:

| Computational Unit (array clock cycle) | Computed Value |
| --- | --- |
| A(1) | 0 + H3*X(7) |
| B(1) | 0 + H3*X(6) |
| C(1) | 0 + H3*X(5) |
| D(1) | 0 + H3*X(4) |
| E(1) | A(0) + H2*X(4) |
| F(1) | B(0) + H2*X(3) |
| G(1) | C(0) + H2*X(2) |
| H(1) | D(0) + H2*X(1) |
| I(1) | E(0) + H1*X(1) |
| J(1) | F(0) + H1*X(0) |
| K(1) | G(0) + 0 |
| L(1) | H(0) + 0 |
| M(1) through P(1) | 0 |

Figure 5C:
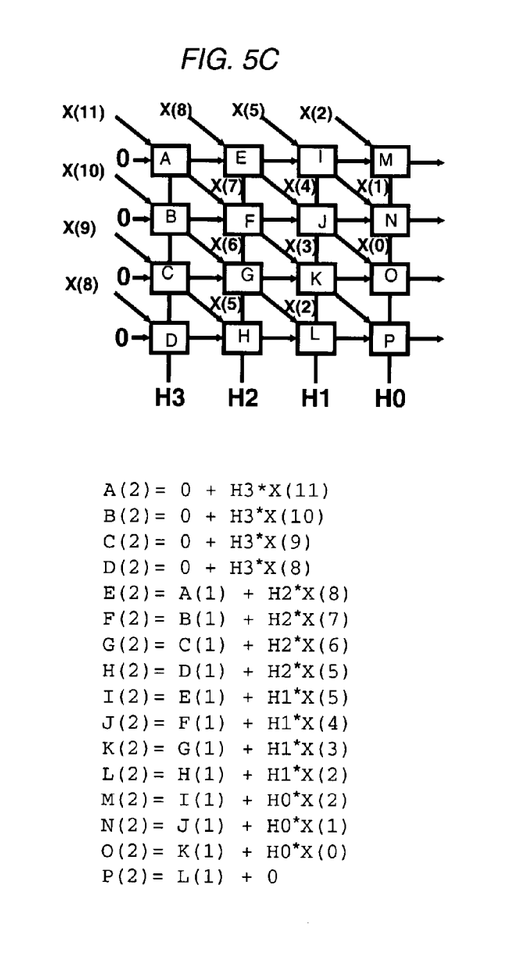
Figure 5D:
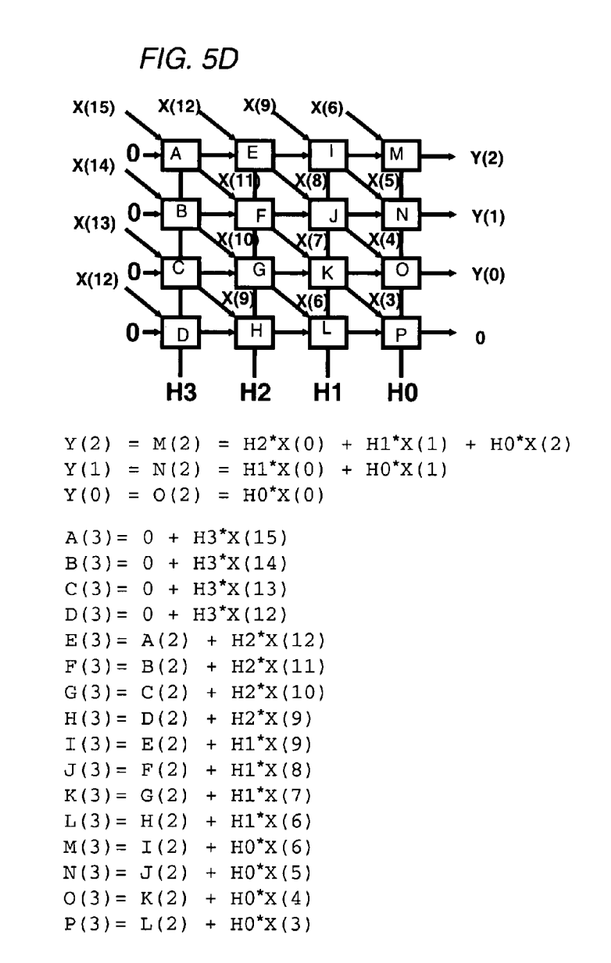
Figure 5E:
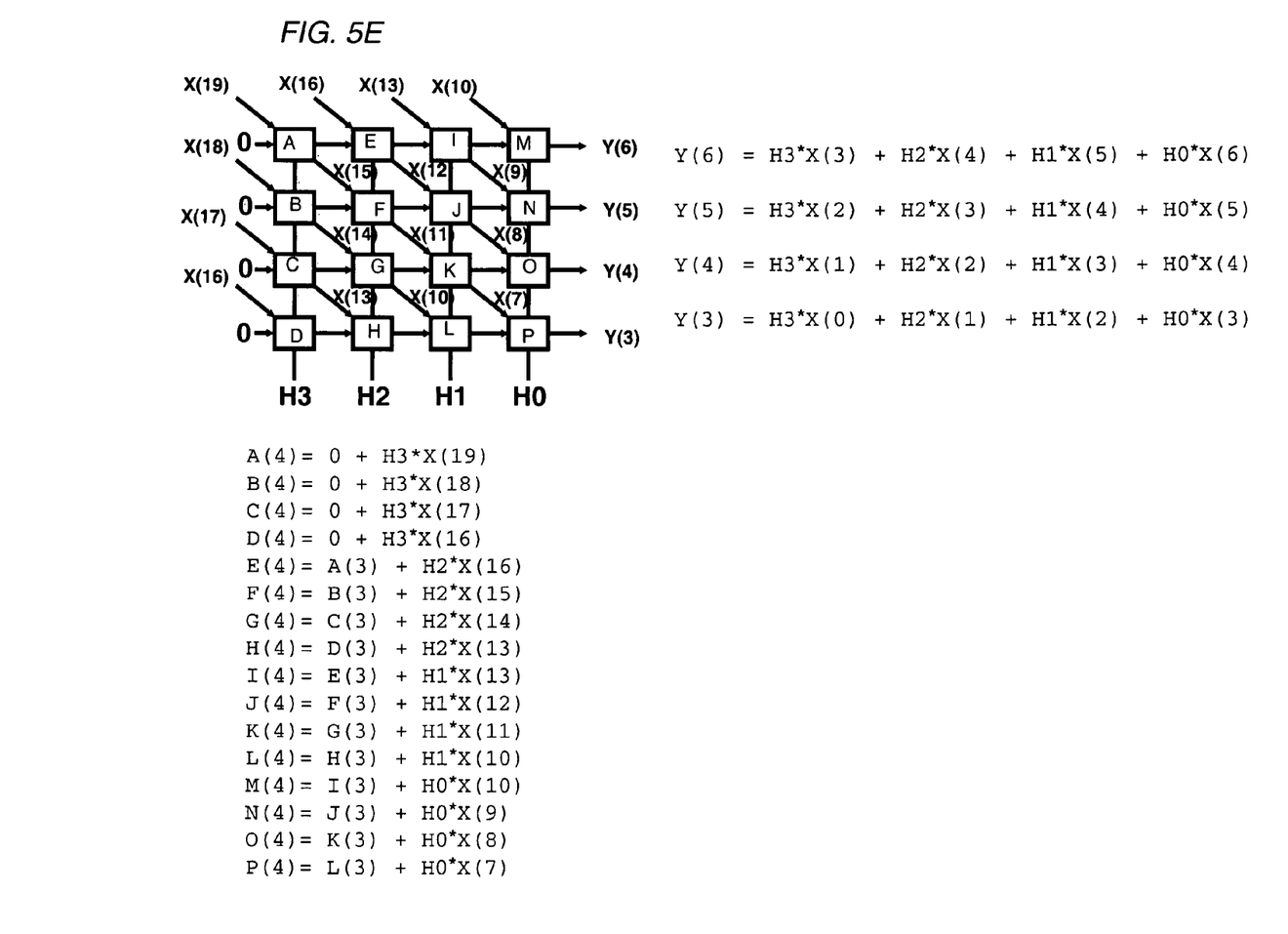

During the next three array clock cycles, shown respectively by FIG. 5C, FIG. 5D, and FIG. 5E, the demultiplexer 54 distributes data samples to the first column and first row, previous data samples propagate diagonally, and computed sums propagate horizontally similar to that described above in connection with FIG. 5A and FIG. 5B. The table below illustrates the results of each array clock cycle.

| Clock Cycle CLK (2) | | Clock Cycle CLK (3) | | Clock Cycle CLK (4) | |
| --- | --- | --- | --- | --- | --- |
| Comp'l Unit | Computed Value | Comp'l Unit | Computed Value | Comp'l Unit | Computed Value |
| A(2) | 0 + H3*X(11) | A(3) | 0 + H3*X(15) | A(4) | 0 + H3*X(19) |
| B(2) | 0 + H3*X(10) | B(3) | 0 + H3*X(14) | B(4) | 0 + H3*X(18) |
| C(2) | 0 + H3*X(9) | C(3) | 0 + H3*X(13) | C(4) | 0 + H3*X(17) |
| D(2) | 0 + H3*X(8) | D(3) | 0 + H3*X(12) | D(4) | 0 + H3*X(16) |
| E(2) | A(1) + H2*X(8) | E(3) | A(2) + H2*X(12) | E(4) | A(3) + H2*X(16) |
| F(2) | B(1) + H2*X(7) | F(3) | B(2) + H2*X(11) | F(4) | B(3) + H2*X(15) |
| G(2) | C(1) + H2*X(6) | G(3) | C(2) + H2*X(10) | G(4) | C(3) + H2*X(14) |
| H(2) | D(1) + H2*X(5) | H(3) | D(2) + H2*X(9) | H(4) | D(3) + H2*X(13) |
| I(2) | E(1) + H1*X(5) | I(3) | E(2) + H1*X(9) | I(4) | E(3) + H1*X(13) |
| J(2) | F(1) + H1*X(4) | J(3) | F(2) + H1*X(8) | J(4) | F(3) + H1*X(12) |
| K(2) | G(1) + H1*X(3) | K(3) | G(2) + H1*X(7) | K(4) | G(3) + H1*X(11) |
| L(2) | H(1) + H1*X(2) | L(3) | H(2) + H1*X(6) | L(4) | H(3) + H1*X(10) |
| M(2) | I(1) + H0*X(2) | M(3) | I(2) + H0*X(6) | M(4) | I(3) + H0*X(10) |
| N(2) | J(1) + H0*X(1) | N(3) | J(2) + H0*X(5) | N(4) | J(3) + H0*X(9) |
| O(2) | K(1) + H0*X(0) | O(3) | K(2) + H0*X(4) | O(4) | K(3) + H0*X(8) |
| P(2) | L(1) + 0 | P(3) | L(2) + H0*X(4) | P(4) | L(3) + H0*X(7) |

During the fourth array clock cycle CLK(3), the array produces the first output data samples based on the input data samples, here identified as Y(0), Y(1), and Y(2) (a fourth output produced by the bottom row of computational units has a value of 0). The output data sample Y(0) corresponds to the results computed by the computational unit O(2) during the third array clock cycle CLK(2). The output data sample Y(1) corresponds to the results computed by the computational unit N(2) and the output data sample Y(2) corresponds to those computed by the computational unit M(2). During the fifth array clock cycle CLK(4), the array produces four more output data samples, here identified as Y(3), Y(4), Y(5), and Y(6), corresponding to the values computed by computational units P, O, N, and M, respectively, during fourth array clock cycle CLK(3). The following table illustrates the values of the various output data samples.

| Output Data Samples during CLK(3) | Output Data Samples during CLK(4) |
|---|---|
| Y(0) = H0X(0) | Y(3) = H3X(0) + H2X(1) + H1X(2) + H0X(3) |
| Y(1) = H1X(0) + H0X(1) | Y(4) = H3X(1) + H2X(2) + H1X(3) + H0X(4) |
| Y(2) = H2X(0) + H1X(1) + H0X(2) | Y(5) = H3X(2) + H2X(3) + H1X(4) + H0X(5) |
|  | Y(6) = H3X(3) + H2X(4) + H1X(5) + H0X(6) |

For each subsequent array clock cycle, this embodiment of FIR filter 58 produces four output data samples. Because the array clock rate is one-fourth the rate of the input data rate, the output data rate is equal to the input data rate. If, for example, this array clock rate represented the maximum array clock speed, and it is desirable to run the array clock at half the speed in order to increase power efficiency, a FIR filter can be designed with twice the number of phases (i.e., eight) and still achieve an output data rate that equals the input data rate.

In addition to the above-described FIR filter embodiments that produce an output data rate equal to the input data rate, other embodiments of FIR filters can employ the array architecture of the invention to produce an output data rate that is either less than or greater than the input data rate. FIR filters that produce a lesser output data rate are referred to as decimating FIR filters; those that produce a greater output data rate, as interpolating FIR filters.

In general, decimating FIR filters ignore input data samples. For an example of a FIR filter that "decimates by two" (i.e., keeps every other sample), consider the FIR filter array 78 of FIG. 3 in which the computational units 82 of the second and fourth phases (here, rows) do not perform any computations (i.e., no multiplications, although the summing of zero values can still be performed). The array clock rate is one-fourth the input clock rate. During each array clock cycle, the computational units of each phase, including the second and fourth phases, communicate input data samples and the decimating FIR filter produces two output data samples provided by the first and third phases. To design a FIR filter that decimates by three, two out of every three phases (e.g., of a three-, six-, nine-, twelve-phase, etc. filter) do not perform computations.

Interpolating FIR filters have a greater number of phases than the number of different input data samples that currently pass to those phases. For example, consider an interpolating FIR filter that interpolates by two: having eight phases and input data samples passing to every other phase in round robin fashion during each array clock cycle (i.e., four input data samples). Those phases not receiving an input data sample can receive a zero value (or alternatively, a repeated value of the input data sample passing to the phase above). As a hardware simplification, any multiplier of a computational unit that consistently receives a zero value can be omitted from the design. Here, the array clock operates at one-fourth the input clock rate and the interpolating FIR filter produces eight output data samples during each array clock cycle. Thus, the output data rate is twice the input data rate.

Figure 6:
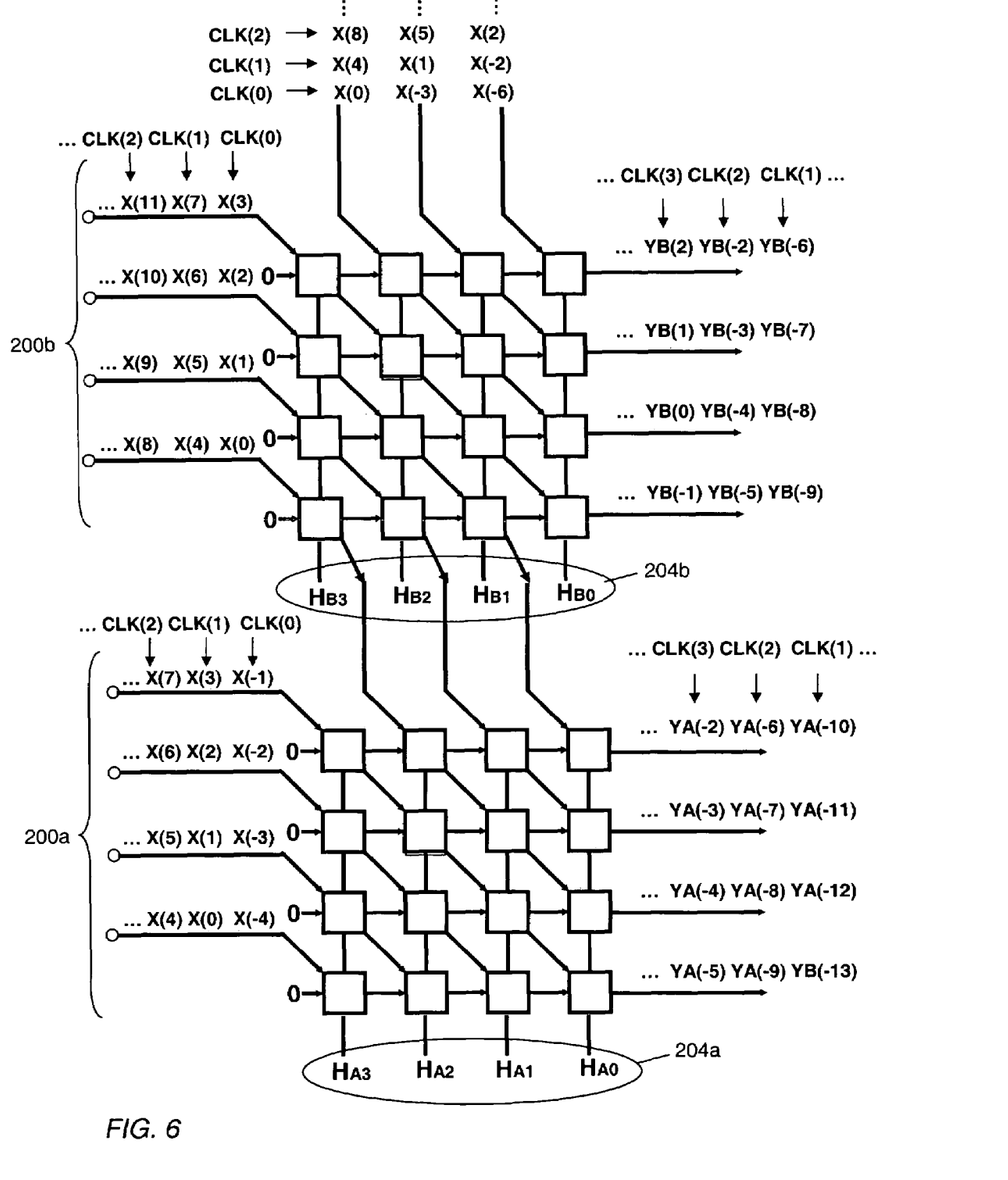
FIG. 6 is a functional block diagram of an embodiment of a filter comprised of stacked FIR filters of the present invention.

FIR filters of the present invention can also be "stacked" or combined to achieve a variety of signal-filtering responses. FIG. 6 shows an example of a pair of stacked FIR filters 200a and 200b. In this example, each of the FIR filters 200a, 200b has four taps and four phases. Such stacking can extend two more than two FIR filters without departing from the principles of the invention.

A demultiplexer (not shown) receives and buffers input data samples at an input data rate and sends these data samples to the FIR filters 200a, 200b. The FIR filters 200a, 200b receive the same input data samples, the bottom filter 200a receiving the input data samples one clock cycle after the top filter 200b receives them. Each computational unit in the first and second FIR filters 200a, 200b operates at an array clock rate that is slower than this input data rate. The FIR filters 200a, 200b use a different set of coefficients 204a, 204b, respectively, for use by the computational units in multiplication. During each array clock cycle, data samples propagate diagonally from the bottom row of the top filter 200b to the top row of the bottom filter 200a, and each FIR filter 200a, 200b produces a plurality of output data samples that achieves an output data rate equal to the input data rate. For stacked-filter embodiments in which the bottom filter 200a has fewer taps than the top filter 200b, the input data samples coming from the extra taps of the top filter 200b are ignored (i.e., unused).

While the invention has been shown and described with reference to specific preferred embodiments, it should be understood by those skilled in the art that various changes in form and detail may be made therein without departing the spirit and scope of the invention as defined by the following claims.

What is claimed is:

1. A signal processor circuit, comprising:
   a demultiplexer circuit receiving input data samples at an input data rate; and
   a finite impulse response (FIR) filter circuit in communication with the demultiplexer circuit for obtaining the input data samples therefrom at the input data rate, the FIR filter circuit including a plurality of computational unit circuits arranged in an array having a plurality of taps and a plurality of phases, each computational unit circuit including circuitry that receives some of the input data samples obtained from the demultiplexer circuit and computes values based on these received input data samples at an array clock rate that is slower than the input data rate, wherein during each array clock cycle the demultiplexer circuit forwards input data samples concurrently to each phase and to each tap of computational unit circuits.

2. The signal processor circuit of claim 1, wherein the array has N phases, where N is any integer greater than 1, and wherein the array clock rate at which each computational unit circuit computes values is approximately equal to 1/N of the input date rate.

3. The signal processor circuit of claim 1, wherein the plurality of phases produces during each array clock cycle a plurality of output data samples that provides an output data rate equal to the input data rate.

4. The signal processor circuit of claim 1, wherein the plurality of phases produces during each array clock cycle a plurality of output data samples that provides an output data rate that is greater than the input data rate.

5. The signal processor circuit of claim 1, wherein the plurality of phases produces during each array clock cycle an output data rate that is less than the input data rate.

6. The signal processor circuit of claim 1, further comprising a set of coefficients with each coefficient in the set being associated with one of the taps of the FIR filter circuit, each computational unit circuit of a given tap using the coefficient associated with that tap to multiply an input data sample received by that computational unit circuit.

7. The signal processor circuit of claim 6, wherein each coefficient in the set is different from each of the other coefficients in the set.

8. The signal processor circuit of claim 1, wherein the demultiplexer circuit forwards input data samples to the phases of computational unit circuits according to a round robin sequence.

9. A finite impulse response (FIR) filter circuit for filtering input data samples, the FIR filter circuit comprising a plurality of computational unit circuits arranged in a systolic array having a plurality of columns and a plurality of rows, each column of computational unit circuits corresponding to one of a tap and a phase and each row of computational unit circuits corresponding to the other of a tap and a phase, each computational unit circuit in one phase other than a last phase being in communication with a first computational unit circuit in a neighboring tap within the same phase as that computational unit circuit over a first signal line used to communicate a computed value thereto and with a second computational unit circuit in the neighboring tap and in a neighboring phase over a second signal line used to communicate an input data sample thereto, each tap and each phase of the systolic array being adapted to receive concurrently an input data sample from a demultiplexer during each array clock cycle.

10. The FIR filter circuit of claim 9, wherein the array has N phases, where N is any integer greater than 1, each computational unit circuit operates at an array clock rate that is equal to 1/N of an input data rate of the input data samples, and the plurality of phases of computational unit circuits produces during each array clock cycle an output data rate equal to the input data rate.

11. The FIR filter circuit of claim 9, wherein the array has N phases, where N is any integer greater than 1, each computational unit circuit operates at an array clock rate that is equal to 1/N of an input data rate of the input data samples, and the plurality of phases of computational unit circuits produces during each array clock cycle an output data rate that is less than the input data rate.

12. The FIR filter circuit of claim 9, wherein the array has N phases, where N is any integer greater than 1, each computational unit circuit operates at an array clock rate that is slower than an input data rate of the input data samples, and the plurality of phases of computational unit circuits produces during each array clock cycle an output data rate that is greater than the input data rate.

13. The FIR filter circuit of claim 9, further comprising a set of coefficients, each coefficient in the set being associated with one of the taps of the FIR filter, each computational unit circuit of a given tap using the coefficient associated with that tap to multiply an input data sample received by that computational unit circuit.

14. The FIR filter circuit of claim 13, wherein each coefficient in the set is different from each of the other coefficients in the set.

15. A finite impulse response (FIR) filter circuit for filtering input data samples, comprising:

a plurality of computational unit circuits arranged in a systolic array having a plurality of columns and a plurality of rows, each column of computational unit circuits corresponding to one of a tap and a phase and each row of computational unit circuits corresponding to the other of a tap and a phase, each tap and each phase of the systolic array being adapted to receive concurrently an input data sample from a demultiplexer during each array clock cycle, each computational unit circuit in a tap other than a last tap comprising:
  a first input signal line for receiving an input data sample,
  a second input signal line for receiving a coefficient,
  a third input signal line for receiving a supplied value,
  circuitry for computing a value based on the received input data sample, the coefficient, and the supplied value,
  a first output signal line for communicating the value computed by that computational unit circuit to a computational unit circuit in a neighboring tap, and
  a second output signal line for communicating the received input data sample to a computational unit circuit in a neighboring phase of the neighboring tap.

16. The FIR filter circuit of claim 15, wherein the array has N phases, where N is any integer greater than 1, each computational unit circuit operates at an array clock rate that is equal to 1/N of an input data rate of the input data samples, and the plurality of rows of computational unit circuits produces during each array clock cycle an output data rate equal to the input data rate.

17. The FIR filter circuit of claim 15, wherein the array has N phases, where N is any integer greater than 1, each computational unit circuit operates at an array clock rate that is equal to 1/N of an input data rate of the input data samples, and the plurality of phases of computational unit circuits produces during each array clock cycle an output data rate that is less than the input data rate.

18. The FIR filter circuit of claim 15, wherein the array has N phases, where N is any integer greater than 1, each computational unit circuit operates at an array clock rate that is slower than an input data rate of the input data samples, and the plurality of phases of computational unit circuits produces during each array clock cycle an output data rate that is greater than the input data rate.

19. The FIR filter circuit of claim 15, further comprising a delay circuit disposed between the first input signal line and the second output signal line for holding an input data sample for an array clock cycle before that input data sample passes to the computational unit circuit in the neighboring phase and neighboring tap.

20. The FIR filter circuit of claim 15, further comprising a set of coefficients with each coefficient in the set being associated with one of the taps of the FIR filter circuit, each computational unit circuit of a given tap using the coefficient associated with that tap to multiply an input data sample received by that computational unit circuit.

21. The FIR filter circuit of claim 20, wherein each coefficient in the set is different from each of the other coefficient in the set.

22. A signal processor circuit, comprising:
  a demultiplexer circuit receiving input data samples; and
  a first finite impulse response (FIR) filter circuit in communication with the demultiplexer circuit for obtaining the input data samples therefrom, the first FIR filter circuit including a first plurality of computational unit circuits arranged in an array having a plurality of taps and a plurality of phases and a first set of coefficients used by the first plurality of computational unit circuits to compute values based on the input data samples; and a second FIR filter circuit in communication with the demultiplexor circuit for obtaining the input data samples therefrom, the second FIR filter circuit including a second plurality of computational unit circuits arranged in an array having a plurality of taps and a plurality of phases and a second set of coefficients different from the first set of coefficients, the second set of coefficients being used by the second plurality of computational unit circuits to compute values based on the input data samples, wherein at least one of the computational unit circuits in a last phase of the second FIR filter circuit is in communication with one of the computational unit circuits in a first phase of the first FIR filter circuit for communicating an input data sample thereto during each array clock cycle, and wherein during each array clock cycle the demultiplexer circuit forwards input data samples concurrently to each tap and to each phase of computational unit circuits.

23. The signal processor of claim 22, wherein the first FIR filter circuit receives the input data samples from the demultiplexer circuit one array clock cycle after the second FIR filter circuit receives the input data samples.

24. The signal processor of claim 22, wherein the demultiplexer circuit receives the input data samples at an input data rate and wherein each computational unit circuit in the first and second FIR filter circuits operates at an array clock rate that is slower than the input data rate, the plurality of phases of computational unit circuits of the FIR filter circuits producing during each array clock cycle an output data rate equal to the input data rate.

25. The signal processor of claim 22, wherein the demultiplexor circuit receives the input data samples at an input data rate and wherein each computational unit circuit in the first and second FIR filter circuits operates at an array clock rate that is slower than the input data rate, the plurality of phases of computational unit circuits of the FIR filter circuits producing during each array clock cycle an output data rate that is less than the input data rate.

26. The signal processor of claim 22, wherein the demultiplexer circuit receives the input data samples at an input data rate and wherein each computational unit circuit in the first and second FIR filter circuits operates at an array clock rate that is slower than the input data rate, the plurality of phases of computational unit circuits of the FIR filter circuits producing during each array clock cycle an output data rate that is greater than the input data rate.

27. The signal processor of claim 22, wherein the demultiplexor circuit forwards input data samples to the phases of computational unit circuits according to a round robin sequence.

28. The FIR filter circuit of claim 22, wherein each coefficient in the first and second sets of coefficients is different from each of the other coefficients in the first and second sets of coefficients.

29. A method of linearly filtering input data samples, comprising:
receiving at a demultiplexer circuit input data samples at an input data rate;
forwarding by the demultiplexer circuit the input data samples concurrently to a first tap and a first phase of an array of computational unit circuits of a finite impulse filter (FIR) circuit having a plurality of taps and a plurality of phases; and
receiving by the computational unit circuits the input data samples forwarded by the demultiplexer circuit and computing values based on these received input data samples at an array clock rate that is slower than the input data rate.

30. The method of claim 29, further comprising producing by the plurality of phases an output data rate that is equal to the input data rate during each array clock cycle.

31. The method of claim 29, further comprising producing by the plurality of phases an output data rate that is greater than the input data rate during each array clock cycle.

32. The method of claim 29, further comprising producing by the plurality of phases an output data rate that is less than the input data rate during each array clock cycle.

33. The method of claim 29, wherein the step of producing comprises:
receiving by each tap of computational unit circuits a plurality of input data samples;
computing by each computational unit circuit a value based on an input data sample received by that computational unit circuit;
communicating by each tap of computational unit circuits other than a last tap the values computed by those computational unit circuits to the computational unit circuits in a neighboring tap;
communicating by each tap of computational unit circuits other than a last tap input data samples received by those computational unit circuits during a previous array clock cycle to the computational unit circuits in a neighboring phase in the neighboring tap;
communicating by the last tap of computational unit circuits a plurality of computed values corresponding to the output data samples.

34. The method of claim 29, further comprising multiplying input data samples received by the computational unit circuits in a given tap by the same coefficient.

35. The method of claim wherein the step of forwarding includes forwarding the input data samples to the computational unit circuits in the first tap of the array in accordance with a round robin sequence.

* * * * *